(12) United States Patent
Pagaila et al.

(10) Patent No.: US 8,334,169 B2
(45) Date of Patent: Dec. 18, 2012

(54) INTEGRATED CIRCUIT PACKAGING SYSTEM AND METHOD OF MANUFACTURE THEREOF

(75) Inventors: Reza Argenty Pagaila, Singapore (SG); Byung Tai Do, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 10 days.

(21) Appl. No.: 13/095,680

(22) Filed: Apr. 27, 2011

(65) Prior Publication Data

US 2011/0201153 A1  Aug. 18, 2011

Related U.S. Application Data

(62) Division of application No. 12/331,347, filed on Dec. 9, 2008, now Pat. No. 7,952,176.

(51) Int. Cl.
*H01L 21/44* (2006.01)
*H01L 21/48* (2006.01)
*H01L 21/50* (2006.01)

(52) U.S. Cl. . 438/106; 738/127; 738/618; 257/E21.051; 257/E21.059; 257/E21.499; 257/E21.502; 257/E21.509; 257/E21.517; 257/E21.596

(58) Field of Classification Search ............... 438/106, 438/108, 112, 127, 128, 612, 613, 617, 618; 257/E21.051, E21.059, E21.499, E21.502, 257/E21.509, E21.517, E21.596
See application file for complete search history.

(56) References Cited

U.S. PATENT DOCUMENTS

| | | | |
|---|---|---|---|
| 6,245,598 B1 | 6/2001 | Chen et al. | |
| 6,638,792 B2 | 10/2003 | Hui et al. | |
| 6,680,524 B2 | 1/2004 | Minamio et al. | |
| 6,998,344 B2 | 2/2006 | Akram et al. | |
| 7,282,431 B2 | 10/2007 | Kang et al. | |
| 7,952,176 B2 * | 5/2011 | Pagaila et al. | 257/676 |
| 2001/0019852 A1 | 9/2001 | Hashimoto | |
| 2003/0027375 A1 | 2/2003 | Hashimoto | |
| 2006/0043518 A1 * | 3/2006 | Nakaji et al. | 257/458 |
| 2007/0269931 A1 | 11/2007 | Chung et al. | |
| 2008/0042245 A1 | 2/2008 | Lee et al. | |
| 2008/0145589 A1 | 6/2008 | Hung et al. | |
| 2010/0142174 A1 | 6/2010 | Pagaila et al. | |

* cited by examiner

*Primary Examiner* — David Nhu
(74) *Attorney, Agent, or Firm* — Ishimaru & Associates LLP; Mikio Ishimaru (57) ABSTRACT

A method of manufacture of an integrated circuit packaging system includes: providing an integrated circuit having an active side and a non-active side; forming a channel through the integrated circuit; forming an indent, having a flange and an indent side, from a peripheral region of the non-active side; and forming a conformal interconnect, having an offset segment, a sloped segment, and a flange segment, under the indent.

10 Claims, 8 Drawing Sheets

INTEGRATED CIRCUIT PACKAGING SYSTEM AND METHOD OF MANUFACTURE THEREOF

CROSS-REFERENCE TO RELATED APPLICATION(S)

This is a divisional of U.S. patent application Ser. No. 12/331,347 filed Dec. 9, 2008, now U.S. Pat. No. 7,952,176 B2.

The present application contains subject matter related to U.S. patent application Ser. No. 12/331,341. The related application is assigned to STATS ChipPAC Ltd. The subject matter thereof is incorporated herein by reference thereto.

TECHNICAL FIELD

The present invention relates generally to an integrated circuit packaging system and more particularly to an integrated circuit packaging system having an interconnect.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP designs face reliability challenges and higher cost.

Thus, a need still remains for an integrated circuit packaging system providing low cost manufacturing, improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit having an active side and a non-active side; forming a channel through the integrated circuit; forming an indent, having a flange and an indent side, from a peripheral region of the non-active side; and forming a conformal interconnect, having an offset segment, a sloped segment, and a flange segment, under the indent.

Certain embodiments of the invention have other steps or elements in addition to or in place of those mentioned or obvious from the above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure.

Figure 1:
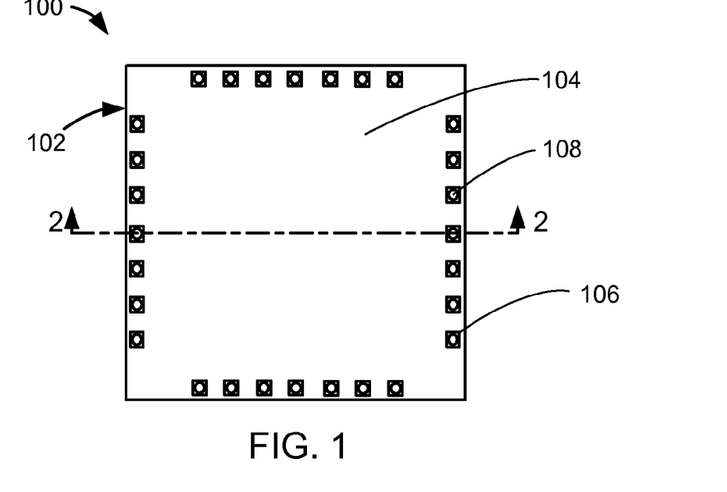
FIG. 1 is a top view of an integrated circuit packaging system in a first embodiment of the present invention.

Referring now to FIG. 1, therein is shown a top view of an integrated circuit packaging system 100 in a first embodiment of the present invention. The top view depicts an integrated circuit 102, such as an integrated circuit die. The integrated circuit 102 can have an active side 104. For example, the active side 104 can include active circuitry (not shown) fabricated thereto. A terminal pad 106, such as a bonding pad, can be exposed at the active side 104. A channel 108, such as a through silicon via, can be exposed within the terminal pad 106.

Figure 2:
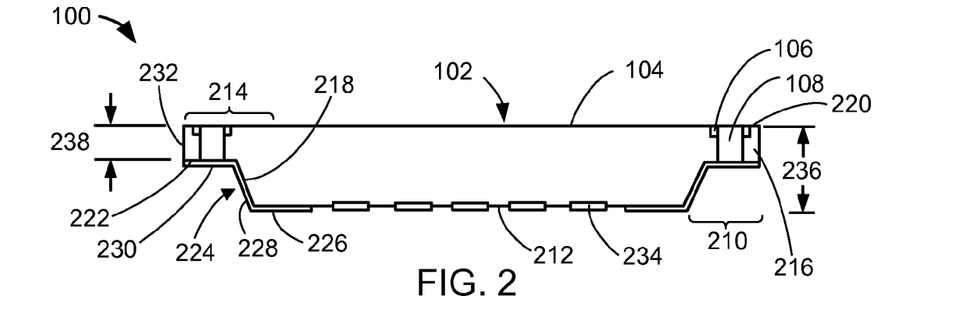
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit 102 can have an indent 210 from a non-active side 212 at a peripheral region 214 of the integrated circuit 102. The indent 210 can include a flange 216 and an indent side 218. The indent side 218 can be between the flange 216 and the non-indent portion of the non-active side 212. The flange 216 can be adjacent to a perimeter of the integrated circuit 102. The flange 216 can have a flange first side 220 and a flange second side 222.

The channel 108 can connect the active side 104 and the non-active side 212. The channel 108 can traverse between the active side 104 and non-active side 212 in a direct, linear, and continuous fashion. The channel 108 can be through the terminal pad 106. The channel 108 can be exposed at the flange second side 222.

For illustrative purposes, the integrated circuit packaging system 100 includes the channel 108 in a vertical configuration between the active side 104 and the non-active side 212, although it is understood that the integrated circuit packaging system 100 can have the channel 108 in a different configuration. For example, the channel 108 can be at an obtuse angle between the active side 104 and the non-active side 212.

A conformal interconnect 224, such as a conductive trace or redistribution layer (RDL), can be over the non-active side 212, the indent side 218 and the flange 216. The conformal interconnect 224 can include an offset segment 226 over the non-active side 212, a sloped segment 228 over the indent side 218, and a flange segment 230 over the flange 216. The offset segment 226 can be at a different height from the flange segment 230.

The conformal interconnect 224 can be conformal to the indent 210 and the non-active side 212 adjacent to the indent 210. The offset segment 226 can be conformal to the non-active side 212.

The sloped segment 228 can be along, under, and conformal to the indent side 218. For illustrative purposes, the indent side 218 is shown at an obtuse angle with the flange 216. Although, it is understood that the indent side 218 can be at a different angle, such as a right or acute angle, with the flange 216, the active side 104, or a combination thereof.

The flange segment 230 can be along, under, and conformal with a flange second side 222 of the flange 216. The flange segment 230 can connect to the channel 108 exposed at the non-active side 212. The flange segment 230 of the conformal interconnect 224 can expose an integrated circuit edge 232 of the integrated circuit 102. The flange segment 230 can be below the terminal pad 106.

Mounting pads 234, such as conductive pads, are not bonding pads of the integrated circuit 102 and can be under and along the non-active side 212. The mounting pads 234 can be connected to one another and to the conformal interconnect 224.

An active side height 236 is the distance from the non-active side 212 to the active side 104. A flange height 238 is the distance from the flange first side 220 to the flange second side 222.

Figure 3:
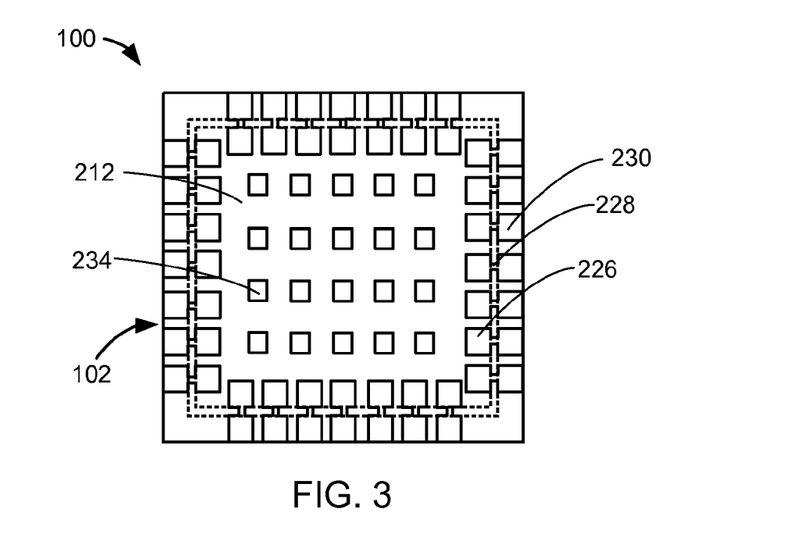
FIG. 3 is a bottom view of the integrated circuit packaging system of FIG. 1.

Referring now to FIG. 3, therein is shown a bottom view of the integrated circuit packaging system 100 of FIG. 1. The bottom view depicts the non-active side 212 of the integrated circuit packaging system 100. The sloped segment 228 can be between the offset segment 226 and the flange segment 230. The offset segment 226 and the flange segment 230 can be wider than the sloped segment 228 providing addition mounting surface area for robust and reliable contact.

For illustrative purposes, the integrated circuit packaging system 100 is shown with the mounting pads 234 in an array configuration, although it is understood that the integrated circuit packaging system 100 can have a different configuration with the mounting pads 234. For example, the mounting pads 234 can be selectively connected to another of the mounting pads 234. As another example, the mounting pads 234 can differ in size, shape, spacing, or a combination thereof from each another of the mounting pads 234.

It has been discovered that the present invention provides an integrated circuit packaging system with a thin profile with high capacity and density mounting pads. The indent and the conformal interconnect over the indent provides a low profile connection option. The channel provides connectivity on both sides of the integrated circuit. The optional mounting pads also provide high number and high density connection options.

Figure 4:
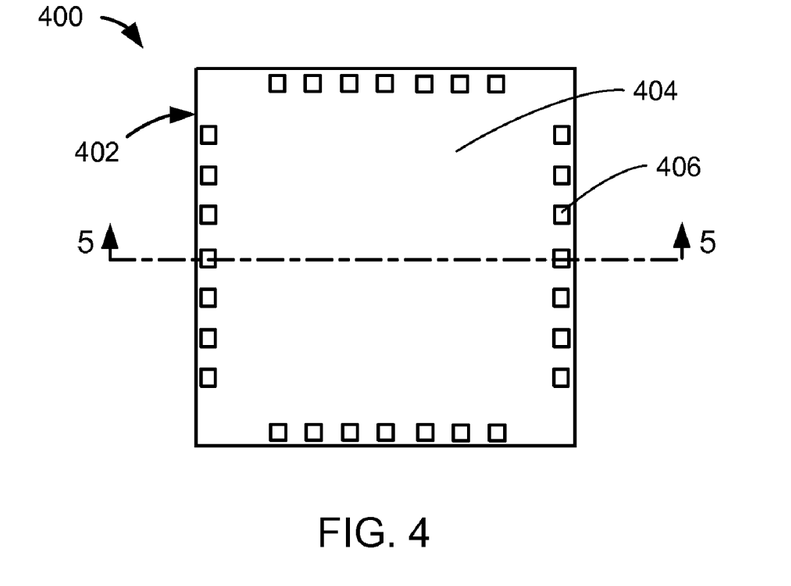
FIG. 4 is a top view of an integrated circuit packaging system in a second embodiment of the present invention.

Referring now to FIG. 4, therein is shown a top view of an integrated circuit packaging system 400 in a second embodiment of the present invention. The top view depicts an integrated circuit 402, such as an integrated circuit die. The integrated circuit 402 can have an active side 404. For example, the active side 404 can include active circuitry (not shown) fabricated thereto. A terminal pad 406, such as a bonding pad, can be exposed at the active side 404.

Figure 5:
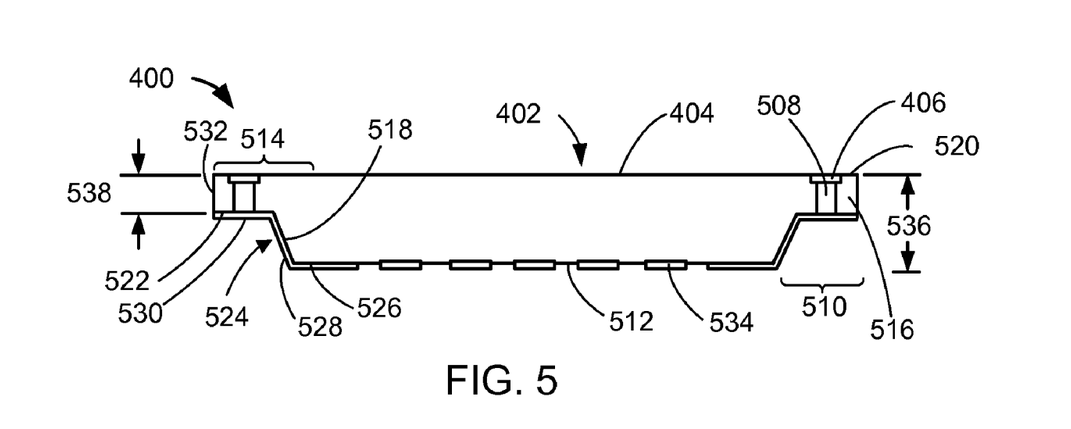
FIG. 5 is a cross-sectional view of the integrated circuit packaging system along line 5-5 of FIG. 4.

Referring now to FIG. 5, therein is shown a cross-sectional view of the integrated circuit packaging system 400 along line 5-5 of FIG. 4. The integrated circuit 402 can have an indent 510 from a non-active side 512 at a peripheral region 514 of the integrated circuit 402. The indent 510 can include a flange 516 and an indent side 518. The indent side 518 can be between the flange 516 and the non-indent portion of the non-active side 512. The flange 516 can be adjacent to a perimeter of the integrated circuit 402. The flange 516 can have a flange first side 520 and a flange second side 522.

A channel 508, such as a through silicon via, can connect the active side 404 and the non-active side 512. The channel 508 can traverse between the non-active side 512 and the active side 404, up to the terminal pad 406, in a direct, linear, and continuous fashion. The channel 508 can be exposed at the flange second side 522.

For illustrative purposes, the integrated circuit packaging system 400 includes the channel 508 in a vertical configuration between the active side 404 and the non-active side 512, although it is understood that the integrated circuit packaging system 400 can have the channel 508 in a different configuration. For example, the channel 508 can be at an obtuse angle between the active side 404 and the non-active side 512.

A conformal interconnect 524, such as a conductive trace or redistribution layer (RDL), can be over the non-active side 512, the indent side 518 and the flange 516. The conformal interconnect 524 can have an offset segment 526 under and along the non-active side 512, a sloped segment 528 under and along the indent side 518, and a flange segment 530 over the flange 516. The offset segment 526 can be at a different height from the flange segment 530.

The conformal interconnect 524 can be conformal to the indent 510 and the non-active side 512 adjacent to the indent 510. The offset segment 526 can be conformal to the non-active side 512.

The sloped segment 528 can be under, along, and conformal to the indent side 518. For illustrative purposes, the indent side 518 is shown at an obtuse angle with the flange 516. Although, it is understood that the indent side 518 can be at a different angle, such as a right or acute angle, with the flange 516, the active side 404, or a combination thereof.

The flange segment 530 can be under, along, and conformal with a flange second side 522 of the flange 516. The flange segment 530 can connect to the channel 508 exposed at the non-active side 512. The flange segment 530 of the conformal interconnect 524 can expose an integrated circuit edge 532 of the integrated circuit 402.

Mounting pads 534, such as conductive pads, are not bonding pads of the integrated circuit 402 and can be under and along the non-active side 512. The mounting pads 534 can be connected to one another and to the conformal interconnect 524.

An active side height 536 is the distance from the non-active side 512 to the active side 404. A flange height 538 is the distance from the flange first side 520 to the flange second side 522.

Figure 6:
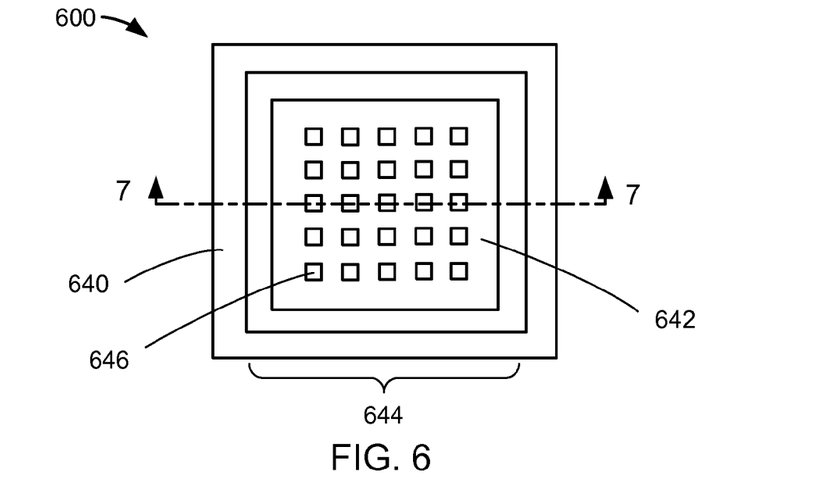
FIG. 6 is a top view of an integrated circuit package-in-package system in a first application example of the integrated circuit packaging system of FIG. 1 in a third embodiment of the present invention.

Referring now to FIG. 6, therein is shown a top view of an integrated circuit package-in-package system 600 in a first application example of the integrated circuit packaging system 100 of FIG. 1 in a third embodiment of the present invention. The top view depicts an encapsulation 640, such as a cover including an epoxy molding compound, with an interposer 642, such as a laminated substrate, exposed in an opening 644 in the encapsulation 640. A contact pad 646 can be exposed from an interposer first side 648 of the interposer 642.

Figure 7:
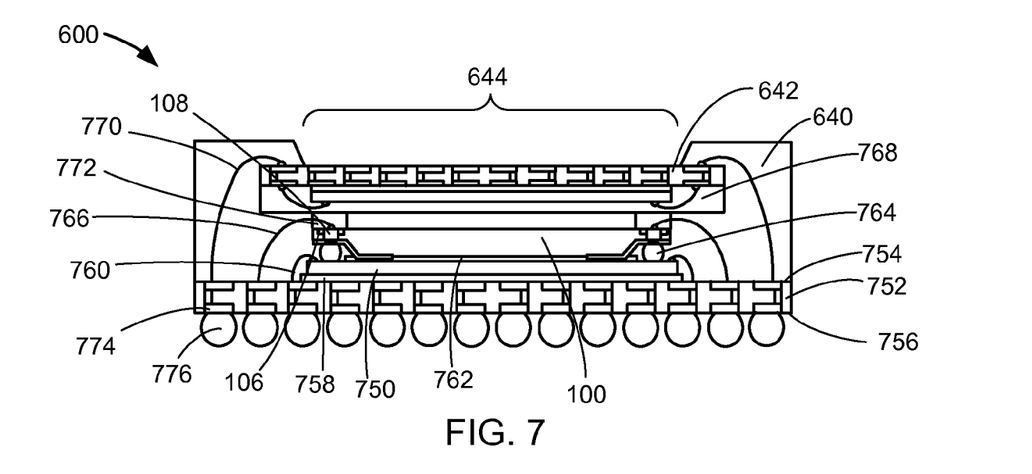
FIG. 7 is a cross-sectional view of the integrated circuit package-in-package system along line 7-7 of FIG. 6.

Referring now to FIG. 7, therein is shown a cross-sectional view of the integrated circuit package-in-package system 600 along line 7-7 of FIG. 6. A first device 750, such as an integrated circuit die, can be over a carrier 752, such as a laminated substrate. The carrier can include a carrier first side 754 and a carrier second side 756. A first adhesive 758, such as a die-attached adhesive, can be between the first device 750 and the carrier 752. A first internal interconnect 760, such as a bond wire or ribbon bond wire, can connect the first device 750 and the carrier 752.

The integrated circuit packaging system 100 can be over the first device 750. A second adhesive 762, such as an adhesive film, can be between the first device 750 and the integrated circuit packaging system 100. For illustrative purposes, an interstack interconnect 764, such as a solder ball or solder bump, can connect the first device 750 and the integrated circuit packaging system 100. Although it is understood that the interstack interconnect 764 can be optional.

A second internal interconnect 766, such as a bond wire or ribbon bond wire, can connect the integrated circuit packaging system 100 and the carrier 752. For example, the second internal interconnect 766 can connect to the terminal pad 106, the channel 108, or a combination thereof.

A second device 768, such as a packaged integrated circuit, having the interposer 642 can be over the integrated circuit packaging system 100. A third internal interconnect 770 such as a bond wire or a ribbon bond wire, can connect the carrier 752 and the second device 768.

An adhesive spacer 772, such as a wire in film adhesive having B-stage characteristics, can be between the integrated circuit packaging system 100 and the second device 768. A material having B-stage characteristics is a material characterized by softening of the material when heated and when in the B-stage the material is uncured. A portion of the second internal interconnect 766 over the connection with the integrated circuit packaging system 100 can be embedded in the adhesive spacer 772.

For illustrative purposes, the adhesive spacer 772 is shown over the flange first side 220. Although it is understood that the adhesive spacer 772 can have a different configuration. For example, the adhesive spacer can be over the active side 104 beyond the flange first side 220.

The carrier 752 can have an external interconnect pad 774, such as a contact pad, exposed at the carrier second side 756. An external interconnect 776, such as a solder ball, can be connected to the external interconnect pad 774.

The encapsulation 640 can be over the carrier 752 covering the first device 750, the first internal interconnect 760, the integrated circuit packaging system 100, the second internal interconnect 766, the second device 768, the third internal interconnect 770, and the interposer 642. The opening 644 of the encapsulation 640 can expose the interposer 642.

Figure 8:
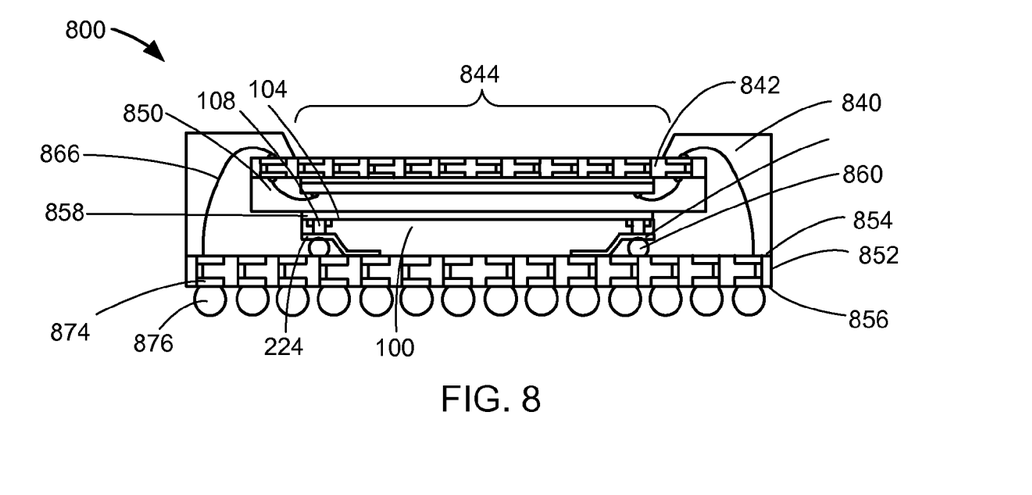
FIG. 8 is a cross-sectional view of the integrated circuit package-in-package system in a second application example of the integrated circuit packaging system of FIG. 1 exemplified by the top view along line 7-7 of FIG. 6 in a fourth embodiment of the present invention.

Referring now to FIG. 8, therein is shown a cross-sectional view of an integrated package-in-package system 800 in a second application example of the integrated circuit packaging system 100 of FIG. 1 exemplified by the top view along line 7-7 of FIG. 6 in a fourth embodiment of the present invention. The integrated circuit packaging system 100 can be over a carrier 852, such as laminated substrate. The carrier 852 can include a carrier first side 854 and a carrier second side 856.

A first internal interconnect 860, such as a solder ball or a solder bump, can connect the integrated circuit packaging system 100 and the carrier 852. The first internal interconnect 860 can connect to the conformal interconnect 224. The conformal interconnect 224 connects to the active side 104 through the channel 108.

A device 850, having an interposer 842, can be over the integrated circuit packaging system 100. An adhesive 858 can be between the integrated circuit packaging system 100 and the device 850. A second internal interconnect 866, such as a bond wire or ribbon bond wire, can connect the device 850 and the carrier 852.

The carrier 852 can have an external interconnect pad 874, such as a contact pad, exposed at the carrier second side 856. An external interconnect 876, such as a solder ball, can be connected to the external interconnect pad 874.

An encapsulation 840, such as a cover including an epoxy molding compound, can be over the carrier 852 covering the device 850, the first internal interconnect 860, the integrated circuit packaging system 100, the second internal interconnect 866, and the interposer 842. An opening 844 of the encapsulation 840 can expose the interposer 842.

Figures 9, 10:
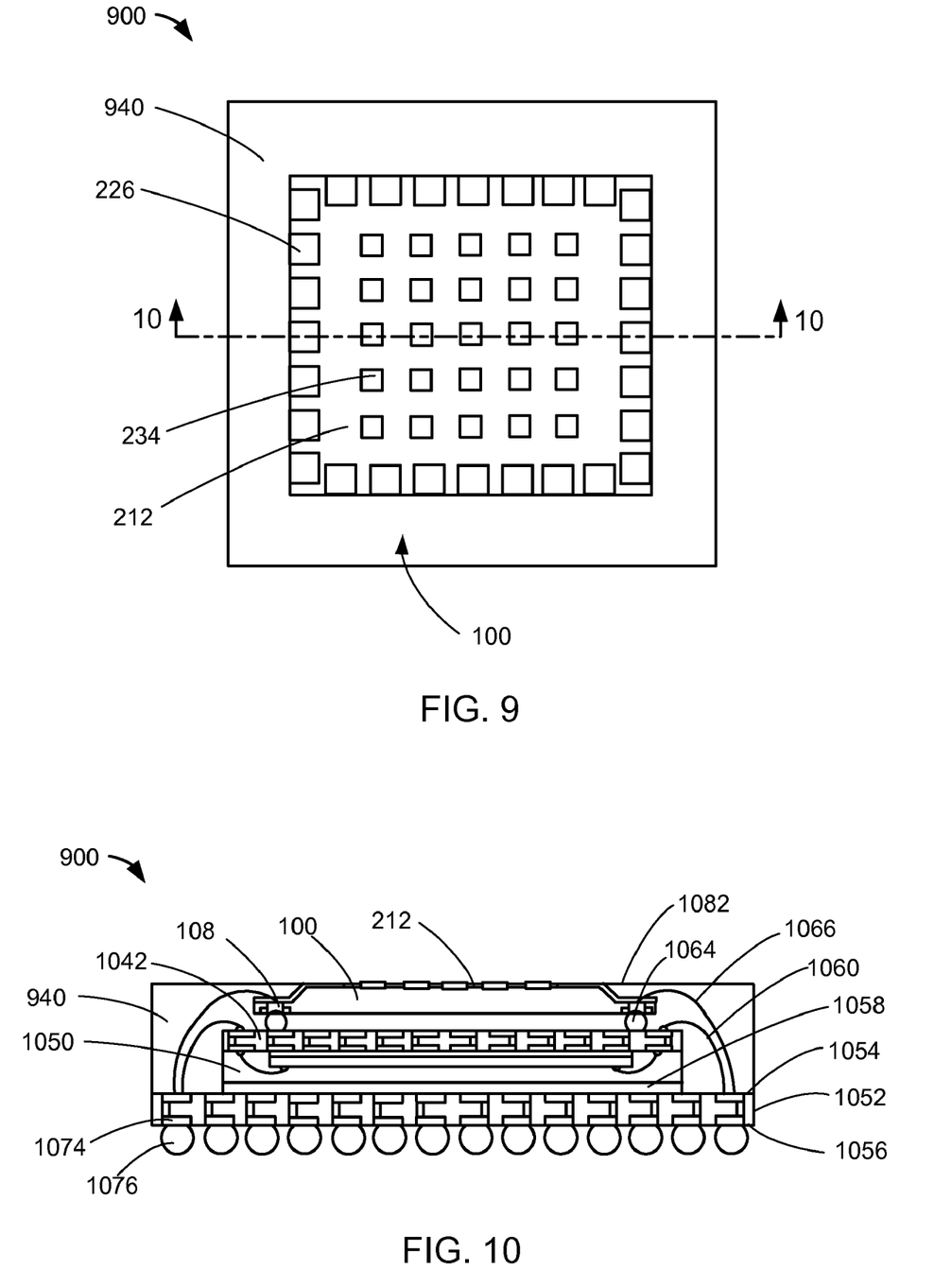
FIG. 9 is a top view of an integrated circuit package-in-package system in a third application example of the integrated circuit packaging system of FIG. 1 in a fifth embodiment of the present invention.
FIG. 10 is a cross-sectional view of the integrated circuit package-in-package system along line 10-10 of FIG. 9.

Referring now to FIG. 9, therein is shown a top view of an integrated circuit package-in-package system 900 in a third application example of the integrated circuit packaging system 100 of FIG. 1 in a fifth embodiment of the present invention. The top view depicts an encapsulation 940, such as a cover including an epoxy molding compound. The encapsulation 940 can expose the non-active side 212, the offset segment 226, and the mounting pads 234.

Referring now to FIG. 10, therein is shown a cross-sectional view of the integrated circuit package-in-package system 900 along line 10-10 of FIG. 9. A first device 1050, such as a packaged integrated circuit, can be over a carrier 1052, such as a laminated substrate. The carrier 1052 can include a carrier first side 1054 and a carrier second side 1056. The first device 1050 can include an interposer 1042, such as a laminated substrate.

An adhesive 1058, a device-attached adhesive, can be between the carrier 1052 and the first device 1050. A first internal interconnect 1060, such as a bond wire or ribbon bond wire, can connect the first device 1050 and the carrier 1052.

The integrated circuit packaging system 100 can be over the first device 1050. An interstack interconnect 1064, such as a solder ball or solder bump, can connect the first device 1050 and the integrated circuit packaging system 100. A second internal interconnect 1066, such as a bond wire or a ribbon bond wire, can connect the carrier 1052 and the integrated circuit packaging system 100. The channel 108 can connect the second internal interconnect 1066 and the interposer 1042.

An external interconnect pad 1074, such as a contact pad, can be exposed at the carrier second side 1056. An external interconnect 1076, such as a solder bump or solder ball, can be attached to the external interconnect pad 1074.

The encapsulation 940 can be over the carrier 1052 covering the first device 1050, the internal interconnect 1060, and the interstack interconnect 1064. An encapsulation top side 1082 of the encapsulation 940 can be planar with the non-active side 212 of the integrated circuit packaging system 100.

Figures 11, 12:
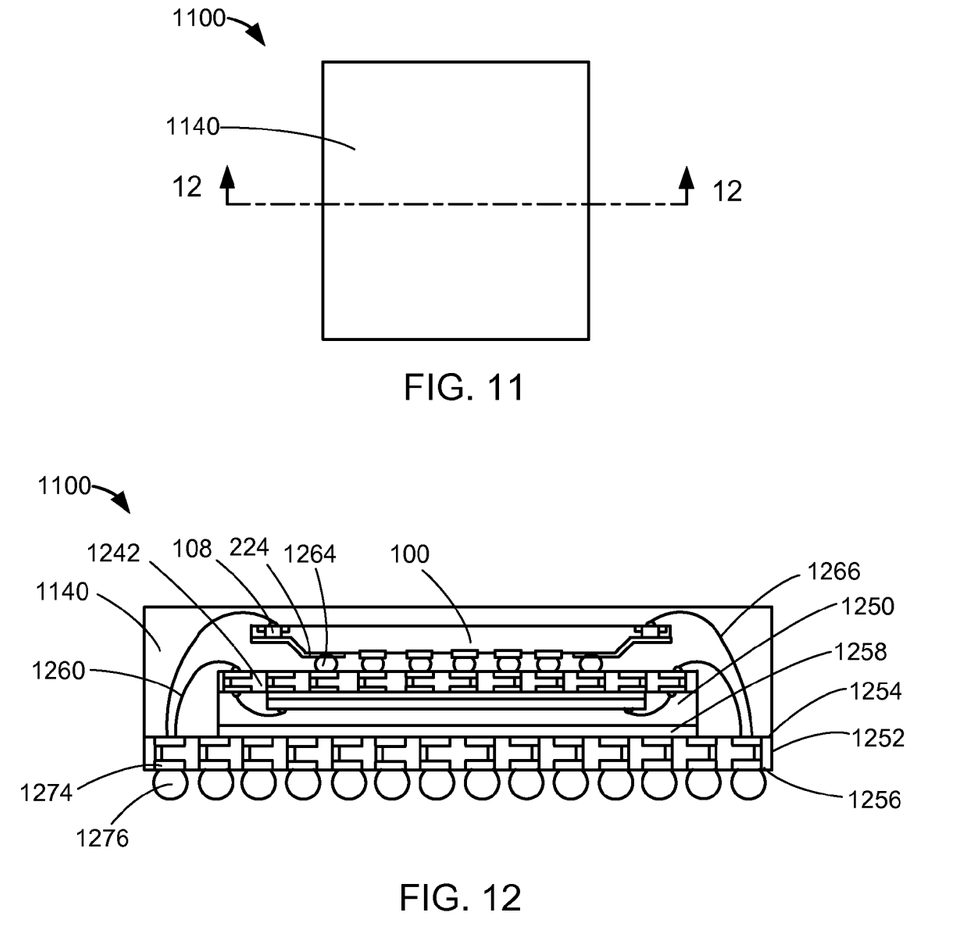
FIG. 11 is a top view of an integrated circuit package-in-package system in a fourth application example of the integrated circuit packaging system of FIG. 1 in a sixth embodiment of the present invention.
FIG. 12 is a cross-sectional view of the integrated circuit package-in-package system along line 12-12 of FIG. 11.

Referring now to FIG. 11, therein is shown a top view of an integrated circuit package-in-package system 1100 in a fourth application example of the integrated circuit packaging system 100 of FIG. 1 in a sixth embodiment of the present invention. The top view depicts an encapsulation 1140, such as a cover including an epoxy molding compound.

For illustrative purposes, the integrated circuit package-in-package system 1100 is shown with the encapsulation 1140 having a square geometric configuration, although it is understood that the encapsulation can have a different geometric configuration. For example, the integrated circuit package-in-package system 1100 can have a rectangular configuration.

Referring now to FIG. 12, therein is shown a cross-sectional view of the integrated circuit package-in-package system 1100 along line 12-12 of FIG. 11. A first device 1250, such as a packaged integrated circuit, can be over a carrier 1252, such as a laminated substrate. The carrier 1252 can include a carrier first side 1254 and a carrier second side 1256. The first device 1250 can include an interposer 1242.

An adhesive 1258, a device-attached adhesive, can be between the carrier 1252 and the first device 1250. A first internal interconnect 1260, such as a bond wire or ribbon bond wire, can connect the first device 1250 and the carrier 1252.

The integrated circuit packaging system 100 can be over the first device 1250. An interstack interconnect 1264, such as a solder ball or solder bump, can connect the first device 1250 and the integrated circuit packaging system 100.

A second internal interconnect 1266, such as a bond wire or a ribbon bond wire, can connect the carrier 1252 and the integrated circuit packaging system 100. The conformal interconnect 224 and the channel 108 can connect the interstack interconnect 1264 and the second internal interconnect 1266.

An external interconnect pad 1274, such as a contact pad, can be exposed at the carrier second side 1256. An external interconnect 1276, such as a solder bump or solder ball, can be attached to the external interconnect pad 1274. The encapsulation 1140 can be over the carrier 1252 covering the first device 1250, the first internal interconnect 1260, the integrated circuit packaging system 100, and the second internal interconnect 1266.

Figure 13:
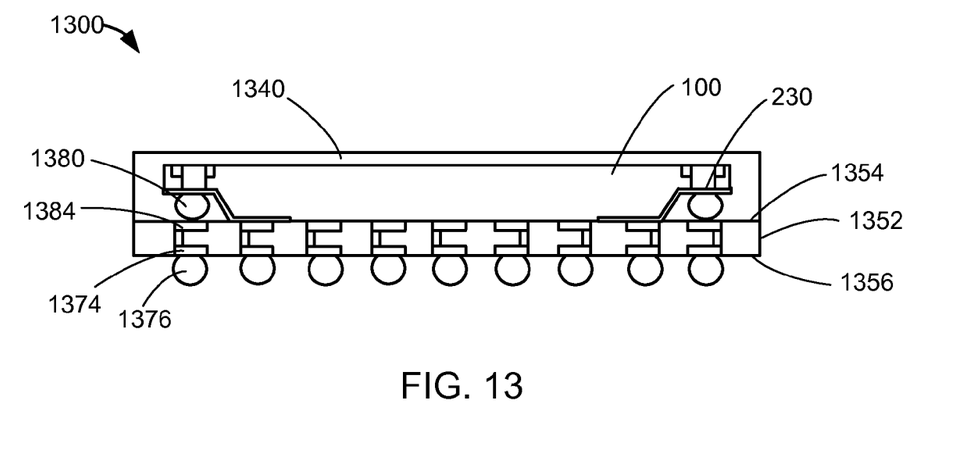
FIG. 13 is a cross-sectional view of an integrated circuit package-in-package system in a fifth application example of the integrated circuit packaging system of FIG. 1 exemplified by the top view along line 12-12 of FIG. 11 in a seventh embodiment of the present invention.

Referring now to FIG. 13, therein is shown a cross-sectional view of an integrated circuit packaging system 1300 in a fifth application example of the integrated circuit packaging system 100 of FIG. 1 exemplified by the top view along line 12-12 of FIG. 11 in a seventh embodiment of the present invention. The integrated circuit packaging system 100 can be over a carrier 1352, such as a laminated substrate. The carrier 1352 can include a carrier first side 1354 and a carrier second side 1356.

An internal interconnect pad 1384, such as a contact pad, can be exposed from a carrier first side 1354 of the carrier 1352. An internal interconnect 1380, such as a solder ball or a solder bump, can connect the flange segment 230 and the internal interconnect pad 1384.

An external interconnect pad 1374, such as a contact pad, can be exposed from the carrier second side 1356. An external interconnect 1376, such as a solder bump or a solder ball, can be connected to the external interconnect pad 1374. An encapsulation 1340 can be over the carrier 1352, the integrated circuit packaging system 100, and the internal interconnect 1380.

It has also been discovered that the present invention provides an integrated circuit package-in-package system with increased packaging density and lower profile. The flange segment enables the conformal interconnect to provide multiple levels of connectivity. The flange segment at the indent enables manufactures to connect the integrated packaging system to a base carrier while allowing the elevated segment and the optional mounting pad to be exposed by the encapsulation. The integrated circuit packaging system can be tested prior to assembly, improving product yield.

Figures 14, 15:
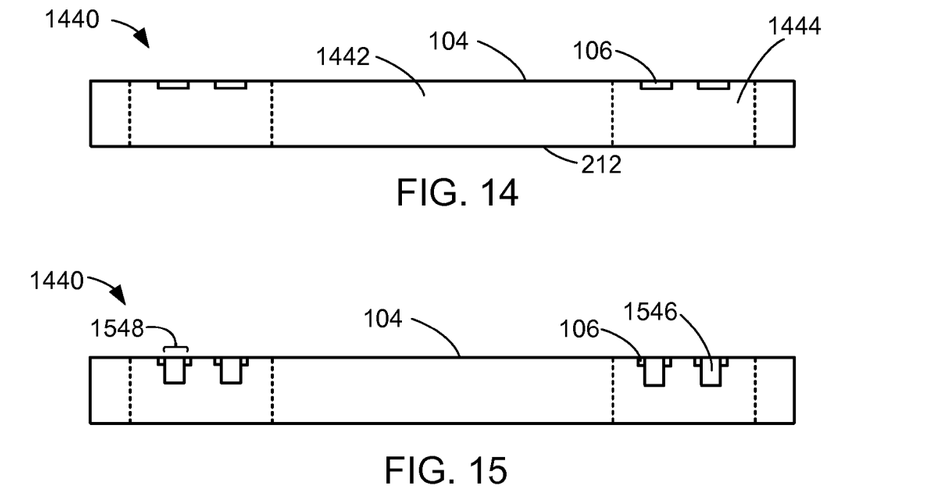
FIG. 14 is a cross-sectional view of a portion of a wafer in a process example of the integrated circuit package of FIG. 1.
FIG. 15 is the structure of FIG. 14 in forming a hole in the wafer.

Referring now to FIG. 14, therein is shown a cross-sectional view of a portion of a wafer 1440 in a process example of the integrated circuit package 100 of FIG. 1. The wafer 1440 can have a device region 1442, such as an un-cut silicon die, and a singulation region 1444, such as a saw street. The device region 1442 and the singulation region 1444 as separated by dotted lines in the figure.

The wafer 1440 can be processed to have the active side 104 and the non-active side 212. For example, the active side 104 can include active circuitry (not shown) fabricated thereto. The terminal pad 106 can be exposed from the active side 104.

Referring now to FIG. 15, therein is shown the structure of FIG. 14 in forming a hole 1546 in the wafer 1440. The hole can be formed through the terminal pad 106 on the active side 104 and partially into the wafer 1440. The hole 1546 can be formed by a number of methods. For example, the hole can be formed by drilling or laser etching. The hole 1546 can be filled with conductive material, such as copper, gold, or a conductive material or alloy, to form a conductive plug 1548.

Figure 16:
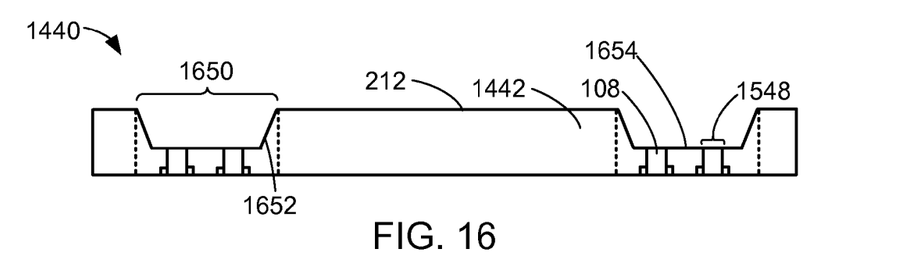
FIG. 16 is the structure of FIG. 15 in forming a recess in the wafer from the non-active side.

Referring now to FIG. 16, therein is shown the structure of FIG. 15 in forming a recess 1650 in the wafer 1440 from the non-active side 212. The recess 1650 can be formed in a number of different ways. For example, the recess 1650 can be formed by methods such as chemical etching, mechanical grinding, or laser cutting. Forming the recess 1650 does not disturb the device region 1442. Forming the recess 1650 forms the channel 108 from the conductive plug 1548.

The recess 1650 can include a recess bottom 1654 and a recess side 1652. For illustrative purposes, the recess side 1652 is shown at an obtuse angle with the recess bottom 1654, although it is understood that the recess side 1652 can form different angles with the recess bottom 1654. For example, the recess side 1652 can form a right angle or an acute angle with the recess bottom 1654.

Figure 17:
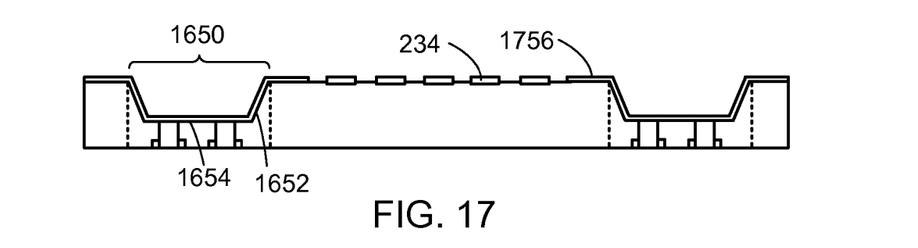
FIG. 17 is the structure of FIG. 16 in forming a conductive structure.

Referring now to FIG. 17, therein is shown the structure of FIG. 16 in forming a conductive structure 1756. The conductive structure 1756 can be formed over the recess side 1652 and the recess bottom 1654.

The conductive structure 1756 can be formed in a number of ways. For example, the conductive structure 1756 can be formed by masking and metal deposition techniques, such as sputtering or electroplating. Optionally, forming the conductive structure 1756 can also include forming the mounting pads 234 over the non-active side.

Figure 18:
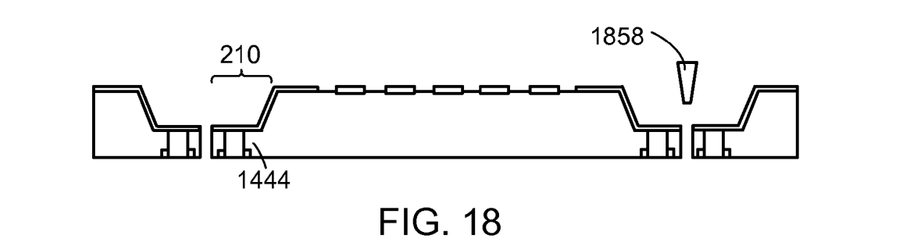
FIG. 18 is the structure of FIG. 17 in forming the integrated circuit packaging system.

Referring now to FIG. 18, therein is shown the structure of FIG. 17 in forming the integrated circuit packaging system 100. The integrated circuit packaging system 100 can be formed by singulating the wafer 1440 of FIG. 16 along the singulation region 1444. Singulation can be performed by a singulation tool 1858. For example, the singulation tool 1858 can include a saw or laser.

Singulation of the wafer 1440 forms the indent 210 from the recess 1650 of FIG. 16 in the integrated circuit packaging system 100. The recess bottom 1654 of FIG. 16 and the recess side 1652 of FIG. 16 can form the indent 210. Furthermore, singulation of the wafer 1440 also forms the conformal interconnect 224.

Figure 19:
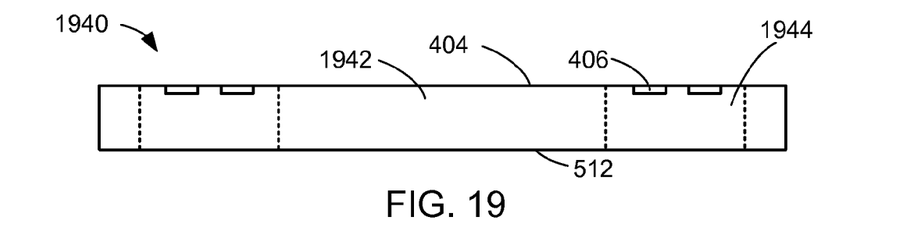
FIG. 19 is a cross-sectional view of a portion of a wafer in a process example of the integrated circuit package of FIG. 4.

Referring now to FIG. 19, therein is shown a cross-sectional view of a portion of a wafer 1940 in a process example of the integrated circuit package 200 of FIG. 4. The wafer 1940 can have a device region 1942, such as an un-cut silicon die, and a singulation region 1944, such as a saw street. The device region 1942 and the singulation region 1944 are separated by dotted lines in the figure.

The wafer 1940 can be processed to have the active side 404 and the non-active side 512. For example, the active side 404 can include active circuitry (not shown) fabricated thereto. The terminal pad 406 can be exposed from the active side 404.

Figure 20:
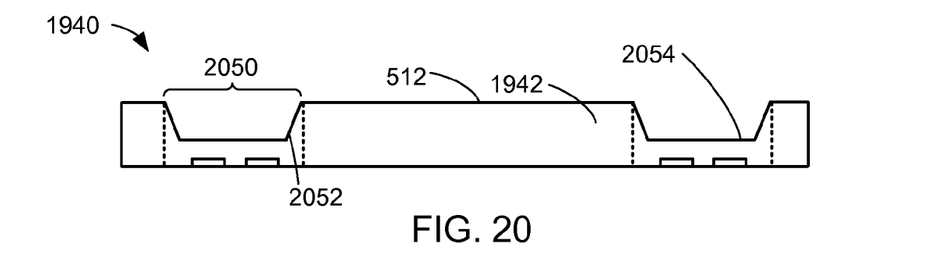
FIG. 20 is the structure of FIG. 19 in forming a recess in the wafer from the non-active side.

Referring now to FIG. 20, therein is shown the structure of FIG. 19 in forming a recess 2050 in the wafer 1940 from the non-active side 512. The recess 2050 can be formed in a number of different ways. For example, the recess 2050 can be formed by methods such as chemical etching, mechanical grinding, or laser cutting. Forming the recess 2050 does not disturb the device region 1942.

The recess 2050 can include a recess bottom 2054 and a recess side 2052. For illustrative purposes, the recess side 2052 is shown at an obtuse angle with the recess bottom 2054, although it is understood that the recess side 2052 can form different angles with the recess bottom 2054. For example, the recess side 2052 can form a right angle or an acute angle with the recess bottom 2054.

Figure 21:
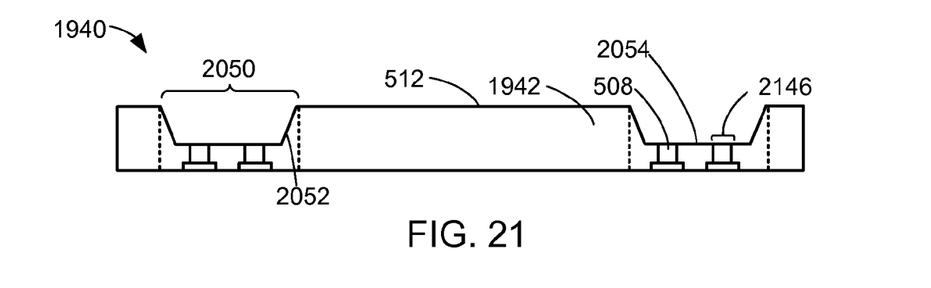
FIG. 21 is the structure of FIG. 20 in forming a hole in the wafer.

Referring now to FIG. 21, therein is shown the structure of FIG. 20 in forming a hole 2146 in the wafer 1940. The hole 2146 can be formed in the recess bottom 2054 and up to the terminal pad 406. The hole 2146 can be formed by a number of methods. For example, the hole can be formed by drilling or laser etching. The hole 2146 can be filled with conductive material, such as copper, gold, or a conductive material or alloy, to form the channel 508.

Figure 22:
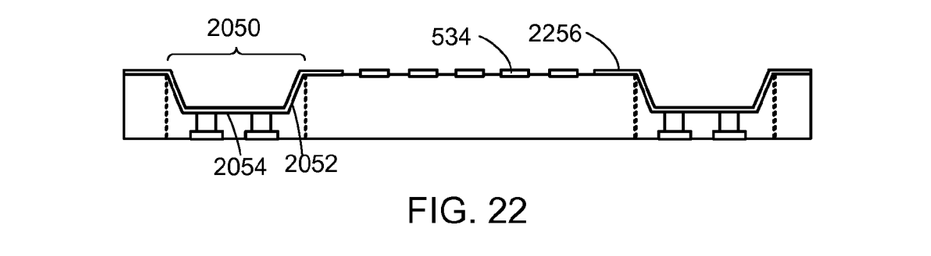
FIG. 22 is the structure of FIG. 21 in forming a conductive structure.

Referring now to FIG. 22, therein is shown the structure of FIG. 21 in forming a conductive structure 2256. The conductive structure 2256 can be formed over the recess side 2052, and the recess bottom 2054. The conductive structure 2256 can be formed in a number of ways. For example, the conductive structure 2256 can be formed by masking and metal deposition techniques, such as sputtering or electroplating. Optionally, forming the conductive structure 2256 can also include forming the mounting pads 534 over the non-active side 512.

Figure 23:
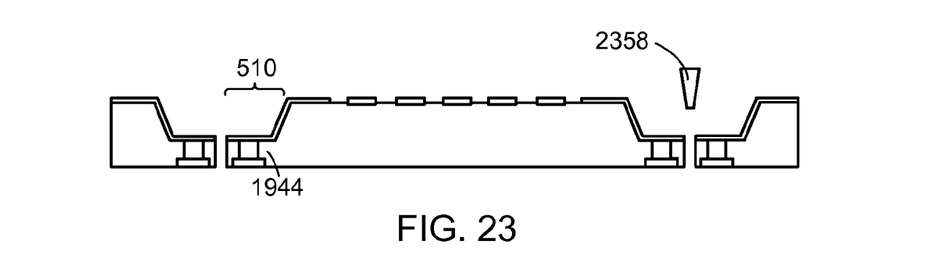
FIG. 23 is the structure of FIG. 22 in forming the integrated circuit packaging system.

Referring now to FIG. 23, therein is shown the structure of FIG. 22 in forming the integrated circuit packaging system 400. The integrated circuit packaging system 400 can be formed by singulating the wafer 1940 of FIG. 13 along the singulation region 1944. Singulation can be performed by a singulation tool 2358. For example, the singulation tool 2358 can include a saw or laser.

Singulation of the wafer 1940 forms the indent 510 from the recess 2050 of FIG. 20 in the integrated circuit packaging system 400. The recess bottom 2054 of FIG. 20 and the recess side 2052 of FIG. 20 can form the indent 510. Furthermore, singulation of the wafer 1940 also forms the conformal interconnect 524.

Figure 24:
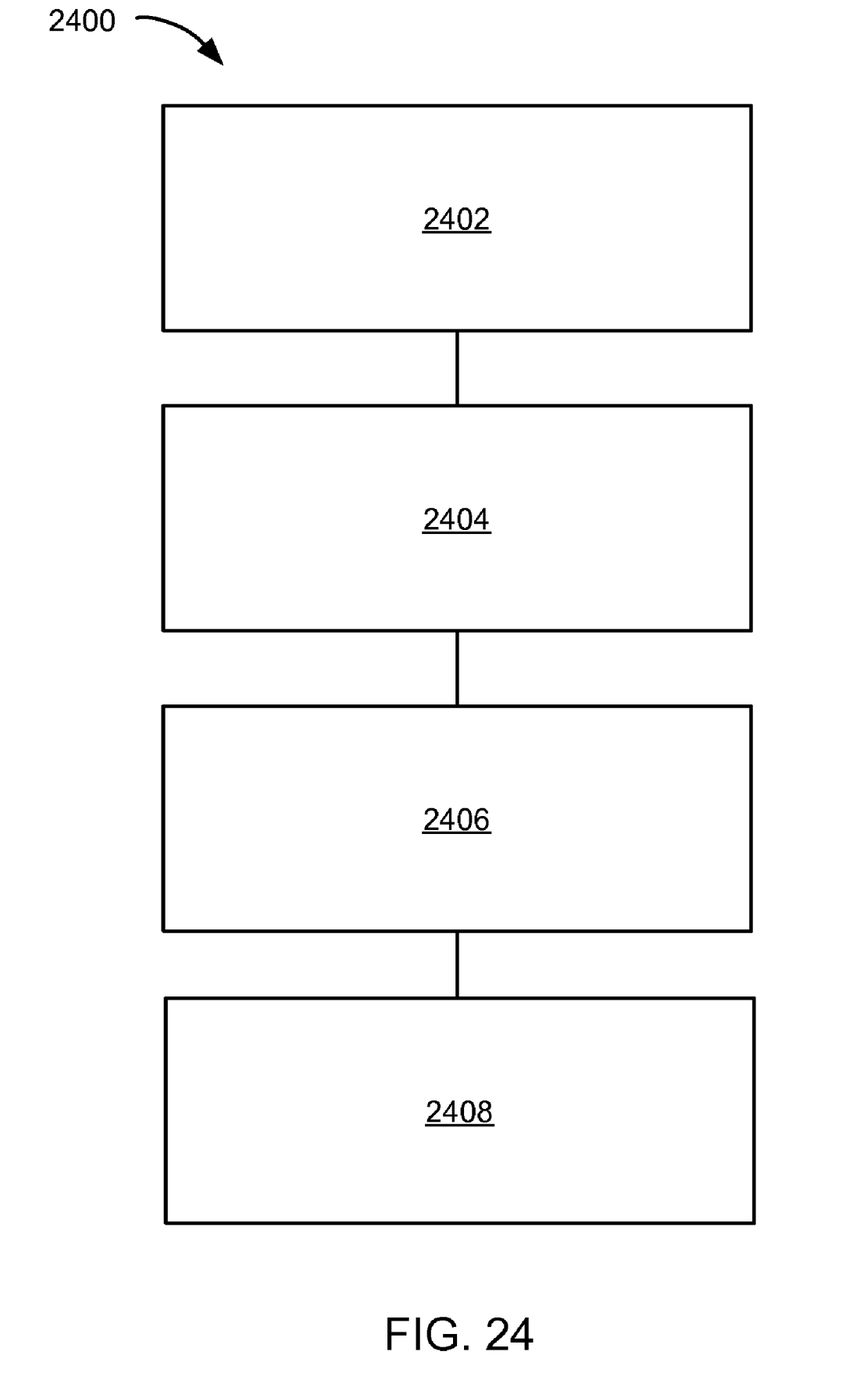
FIG. 24 is a flow chart of a method of manufacture of an integrated circuit packaging system in a further embodiment of the present invention.

Referring now to FIG. 24, therein is shown a flow chart of a method 2400 of manufacture of the integrated circuit packaging system 400 in a further embodiment of the present invention. The method 2400 includes providing an integrated circuit having an active side and a non-active side in block 2402; forming a channel through the integrated circuit in block 2404; forming an indent, having a flange and an indent side, from a peripheral region of the non-active side in block 2406; and forming a conformal interconnect, having an offset segment, a sloped segment, and a flange segment, under the indent in block 2408.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing an integrated circuit having an active side and a non-active side;
    forming a channel through the integrated circuit;
    forming an indent, having a flange and an indent side, from a peripheral region of the non-active side; and
    forming a conformal interconnect, having an offset segment, a sloped segment, and a flange segment, under the indent.

2. The method as claimed in claim 1 wherein:
    providing the integrated circuit includes providing a terminal pad at the active side; and
    forming the indent, having the flange and the indent side, from the peripheral region of the non-active side includes forming the flange below the terminal pad.

3. The method as claimed in claim 1 wherein:
    providing the integrated circuit having the active side includes providing a terminal pad at the active side; and
    forming the conformal interconnect, having the offset segment, under the indent includes connecting the conformal interconnect and the terminal pad.

4. The method as claimed in claim 1 wherein:
    providing the integrated circuit having the active side includes providing a terminal pad at the active side; and
    forming the channel includes forming the channel to the active side through the terminal pad.

5. The method as claimed in claim 1 further comprising forming a mounting pad over the non-active side and adjacent to the offset segment.

6. A method of manufacture of an integrated circuit packaging system comprising:
    providing an integrated circuit having an active side and a non-active side with a terminal pad at the active side;
    forming a channel through the integrated circuit with the channel between the active side and the non-active side;
    forming an indent, having a flange and an indent side, from a peripheral region of the active side; and
    forming a conformal interconnect, having an offset segment, a sloped segment, and a flange segment, under the indent with the flange segment under the channel and with the sloped segment between the flange segment and the offset segment.

7. The method as claimed in claim 6 further comprising:
    providing a carrier;
    mounting the integrated circuit over the carrier;
    connecting the flange segment and the carrier; and
    encapsulating the integrated circuit.

8. The method as claimed in claim 6 further comprising:
    providing a carrier;
    mounting the integrated circuit over the carrier;
    connecting the flange segment and the carrier;
    mounting a device over the integrated circuit;
    connecting the device and the carrier; and
    encapsulating the integrated circuit and the device.

9. The method as claimed in claim 6 further comprising:
    providing a carrier;
    mounting a device over the carrier;
    connecting the device and the carrier;
    mounting the integrated circuit over the device;
    connecting the flange segment and the carrier; and
    encapsulating the integrated circuit and the device with the offset segment exposed.

10. The method as claimed in claim 6 further comprising:
    providing a carrier;
    mounting a first device over the carrier;
    connecting the first device and the carrier;
    mounting the integrated circuit over the first device;
    connecting the flange segment and the carrier;
    mounting a second device over the integrated circuit;
    connecting the second device and the carrier; and
    forming an encapsulation, having an opening, over the first device, the, integrated circuit and the second device with the second device exposed by the opening.

* * * * *